(12) United States Patent
Dufrenne et al.

(10) Patent No.: US 7,208,363 B2
(45) Date of Patent: Apr. 24, 2007

(54) FABRICATION OF LOCAL INTERCONNECT LINES

(75) Inventors: Stephane Dufrenne, Singapore (SG); Mohd Faizal Zainal Abidin, Singapore (SG)

(73) Assignee: Systems on Silicon Manufacturing Co. Pte. Ltd., Singapore (SG)

( * ) Notice: Subject to any disclaimer, the term of this patent is extended or adjusted under 35 U.S.C. 154(b) by 0 days.

(21) Appl. No.: 11/123,833

(22) Filed: May 5, 2005

(65) Prior Publication Data

US 2006/0252195 A1   Nov. 9, 2006

(51) Int. Cl.
*H01L 21/8238* (2006.01)
(52) U.S. Cl. ............... 438/199; 438/618; 438/700; 438/714; 438/734; 257/E27.108; 257/E21.632; 257/E21.249
(58) Field of Classification Search ............... 438/199, 438/233, 672, 675, 715, FOR. 216, 618, 438/700, 714, 734
See application file for complete search history.

(56) References Cited

U.S. PATENT DOCUMENTS

| 4,966,870 | A  | * | 10/1990 | Barber et al. ............... 438/637 |
| 5,759,867 | A  | * | 6/1998 | Armacost et al. ........... 438/639 |
| 6,274,471 | B1 | * | 8/2001 | Huang ........................ 438/597 |
| 2003/0036227 | A1 | * | 2/2003 | Hohnsdorf .................. 438/200 |
| 2005/0101034 | A1 | * | 5/2005 | Aggarwal et al. ............. 438/3 |
| 2005/0200026 | A1 | * | 9/2005 | Liaw .......................... 257/774 |
| 2005/0245074 | A1 | * | 11/2005 | Jiang et al. ................. 438/637 |

* cited by examiner

*Primary Examiner*—Michelle Estrada
(74) *Attorney, Agent, or Firm*—Christie, Parker & Hale, LLP

(57) ABSTRACT

A method of fabricating local interconnect lines (LILs) of a CMOS structures, the method comprising etching an inter layer dielectric (ILD) material of the CMOS structure at a first temperature to form one or more holes and one or more slits; and etching an etch-stop material of the CMOS structure at a second temperature lower than the first temperature to extend the holes and slits to devices of the CMOS structure.

21 Claims, 6 Drawing Sheets

FABRICATION OF LOCAL INTERCONNECT LINES

FIELD OF INVENTION

The present invention relates broadly to a method of fabricating local interconnect lines (LILs) of a CMOS structure.

BACKGROUND

In the semiconductor fabrication industry, during formation of local interconnect lines (LILs) to e.g. active and passive devices of metal-oxide semiconductor (CMOS) structures, inter-layer dielectric (ILD) materials such as oxides and etch-stop materials such as nitrides of the CMOS structures are typically etched and then filled with e.g. W.

The LILs are typically made up of structures referred to as holes and slits. During simultaneous etching of the holes and slits during fabrication of the LILs, a number of problems may occur, such as under-etching of holes. Under-etching of holes causes failure to make electrical contact to the active regions of the CMOS structures. Holes may be under-etched when etched simultaneously with slits, due to a faster etching rate of slits as the latter typically possess larger exposed areas than holes.

In order to address this problem, the etching time is typically increased. However, when etching holes and slits simultaneously, due to the faster etching rate of slits, increasing etching time may typically cause over-etching of the slits. It is therefore desirable to improve the selectivity during the etching of the holes and slits to avoid or reduce unwanted etching of in particular the shallow trench isolation (STI) oxide underneath the etch-stop material. Over-etching into the STI may give rise to junction leakages and thus yield losses during fabrication of CMOS structures.

The above mentioned problem in avoiding over-etching of slits is particularly significant where different types of CMOS structures are fabricated on a single wafer, which is often the case. For example, different CMOS structures fabricated on a wafer may include flash memory modules, static random access memory (SRAM), Logic modules, and control modules (PCM). Table 1 lists typical thicknesses of the ILD material and the etch-stop material in different CMOS structures. As would be appreciated by a person skilled in the art, the variations in thicknesses of the ILD material and the etch-stop material significantly increase the difficulty of choosing a suitable etching time in the processing of such wafers such that yield losses may be reduced. Different ILD and etch-stop material thicknesses within a wafer may be inherent to the typography and pattern density, in particular for poly lines, in the relevant regions.

TABLE 1

| Thickness | PCM | SRAM/Logic | Flash |
|---|---|---|---|
| ILD material (Angstroms) | 9000 | 9000 | 11000 |
| Etch-stop material (Angstroms) | 950 | 900 | 500 |

SUMMARY

In accordance with a first aspect of the present invention there is provided a method of fabricating local interconnect lines (LILs) of a CMOS structures, the method comprising etching an inter layer dielectric (ILD) material of the CMOS structure at a first temperature to form one or more holes and one or more slits; and etching an etch-stop material of the CMOS structure at a second temperature lower than the first temperature to extend the holes and slits to devices of the CMOS structure.

The second temperature may be chosen such that a selectivity of the etch-stop material etching at the second temperature is increased compared to a selectivity of the etch-stop material etching at the first temperature.

The ILD material and the etch-stop material may be etched substantially at the same ambient pressure.

The etch-stop material may be etched at a pressure in a range from about 45 to about 55 milli-Torr.

The etch-stop material may be etched at a pressure chosen such that a mean free path is increased compared to a mean free path at about 100 milli-Torr.

The etch-stop material may be etched at an ambient pressure of about 50 milli-Torr.

The ILD material may be etched at an ambient pressure of about 40 to 50 milli-Torr.

The second temperature may be 25° C.±5° C.

The first temperature may be about 60° C.

An etching agent for the etching of the etch-stop material may comprise a mixture of $CH_3F$ and $O_2$.

The etching agent for the etching of the ILD material may comprise a mixture of $C_4F_8$, oxygen and Argon.

A first processing chamber may be used for the etching of the ILD material and a second processing chamber may be used for the etching of the etch-stop material.

The ILD material may comprise TEOS.

The etch-stop material may comprise SiN.

The CMOS structure may be silicon based.

In accordance with a second apsect of the present invention there is provided a CMOS structure fabricated using the method as defined in the first aspect.

BRIEF DESCRIPTION OF THE DRAWINGS

Embodiments of the invention will be better understood and readily apparent to one of ordinary skill in the art from the following written description, by way of example only, and in conjunction with the drawings, in which:

FIG. 2(*b*) is a cross-sectional view of a section of a CMOS structure after a nitride etch in a process to form LILs in an example embodiment.

DETAILED DESCRIPTION

Embodiments of the present invention provide a method of fabricating LILs of a CMOS structure in which a temperature and ambient pressure during etching are reduced after etching of the ILD material, before the etching of the etch-stop material. The temperature during the etching of the etch-stop material is chosen such that a selectivity during the etching is increased when compared to the selectivity at the temperature at which the ILD material etching was performed. The ambient pressure during the etching of the etch-stop material is chosen such that a mean free path of an etching agent is increased when compared to the mean free path at the ambient pressure at which the etch-stop material etching is performed in previous techniques.

Figure 1:
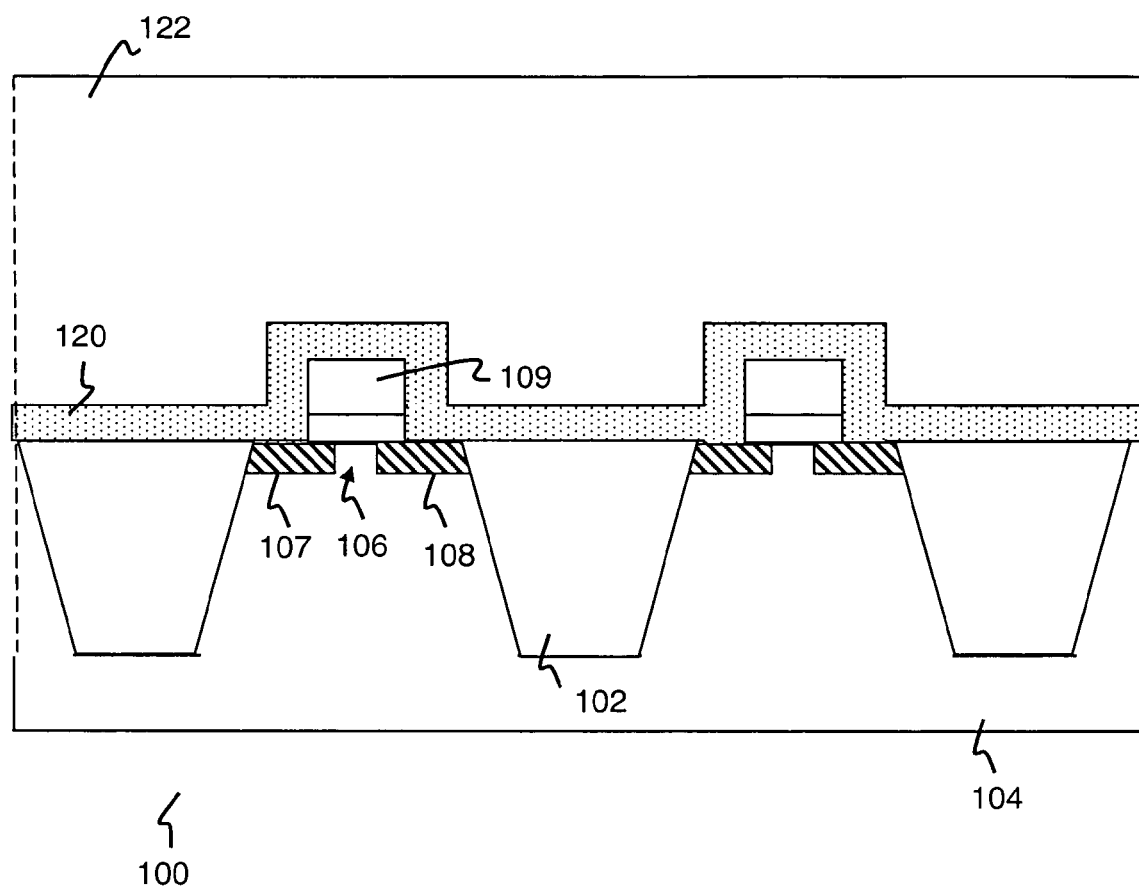
FIG. 1 is a cross-sectional view of a section of a typical CMOS structure before formation of LILs in an example embodiment.

FIG. 1 is a cross-sectional view of a typical CMOS structure 100 before formation of LILs in an example embodiment. The CMOS structure 100 includes shallow trench isolation (STI) oxides, e.g. 102, formed on a wafer 104. The STI oxides, e.g. 102, separate devices such as transistors e.g. 106. The transistor 106 of the CMOS structure 100 comprises Source/Drain (S/D) implants 107, 108 and a polygate 109. An etch-stop layer 120 is deposited on the wafer and thus e.g. on top of the transistors e.g. 106 and the STI oxides, e.g. 102. An ILD layer 122 is deposited on the etch-stop layer 120. The deposited ILD layer 122 may e.g. comprise Tetraethyl Orthosilicate oxide (TEOS) while the etch-stop layer 120 may e.g. comprise silicon nitride (SiN).

Formation of the CMOS structure 100 as illustrated in FIG. 1 may be achieved by any suitable existing processing techniques.

Figure 2:
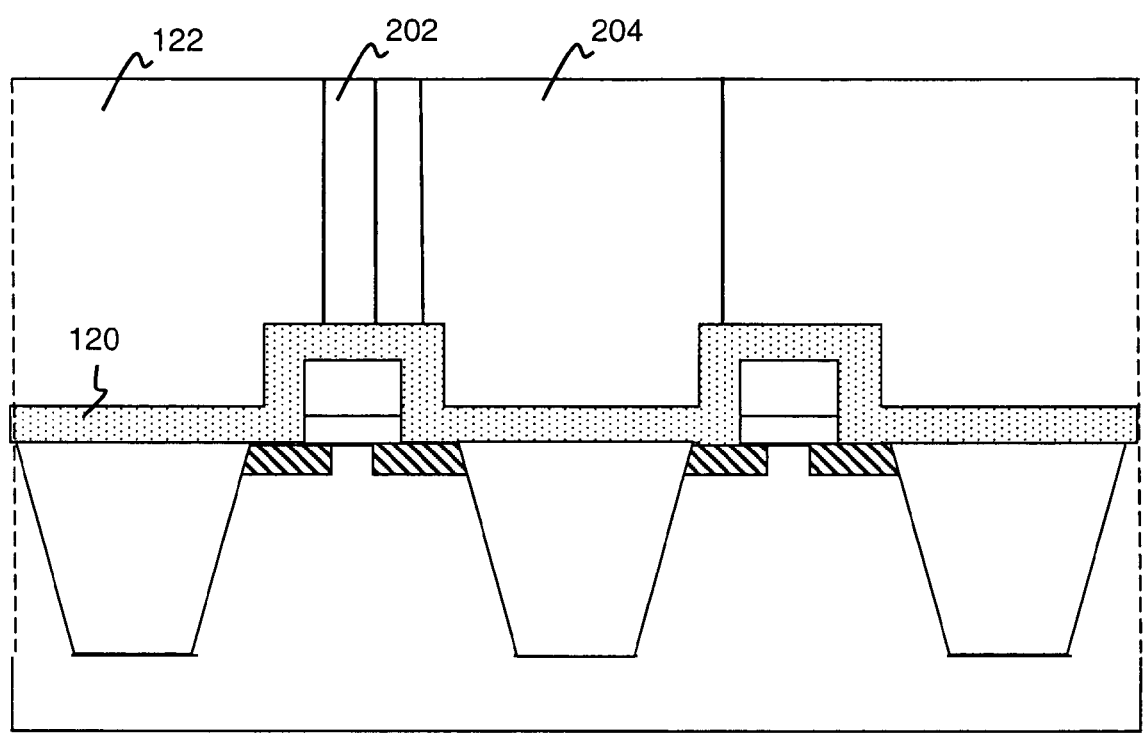
FIG. 2(*a*) is a cross-sectional view of a section of a CMOS structure after an oxide etch in a process to form LILs in an example embodiment.
Figure 2:
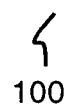
Figure 2:
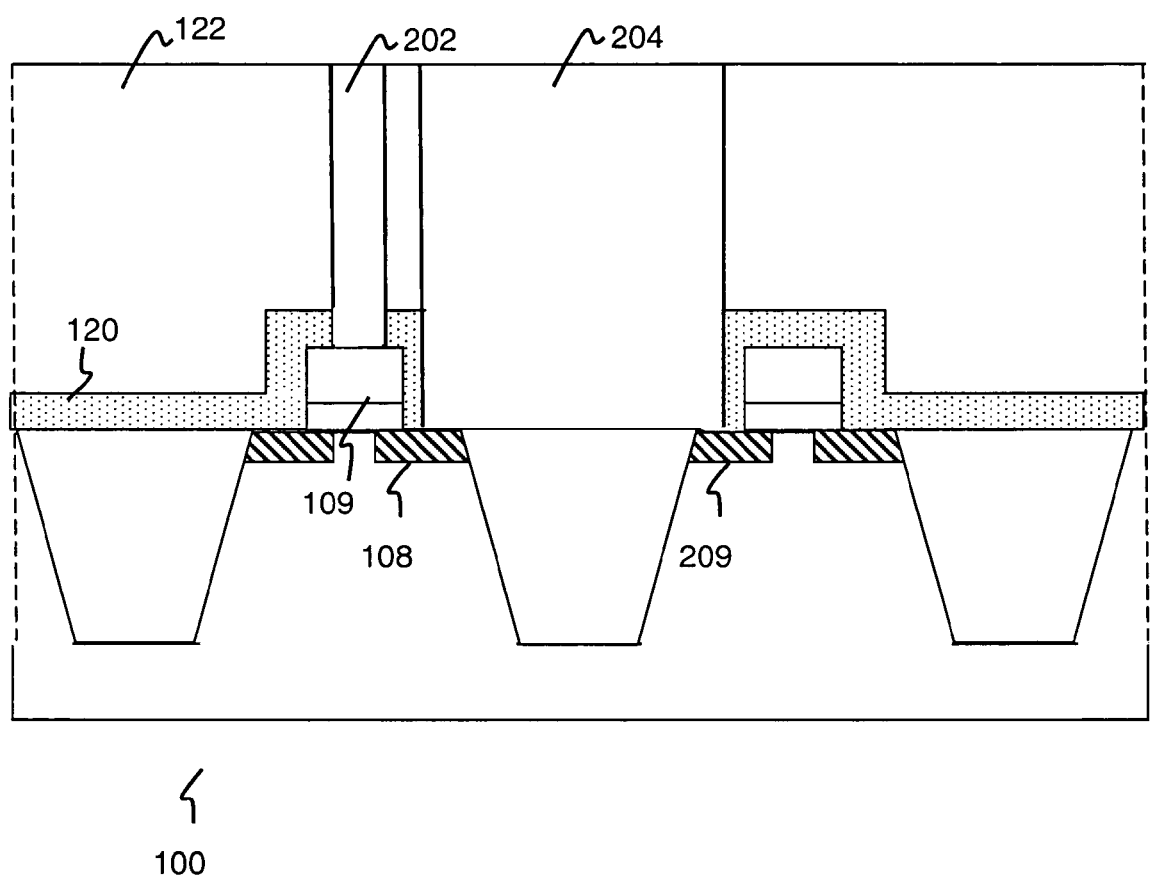

In the formation of the LILs in the example embodiment, with reference to FIG. 2(a), the CMOS structure 100 is subjected to an oxide etch where the wafer 104 is placed on a substrate holder/heater (not shown). The substrate holder/heater is maintained at a temperature of about 60° C. and the ambient pressure during the oxide etch is about 40–50 milli-Torr. The etching agent used in the example embodiment is a mixture of $C_4F_8$, oxygen and Argon. In the example embodiment, the ILD layer 122 undergoes an oxide etch to the extent that the ILD layer 122 is etched to form holes e.g. 202 and slits e.g. 204 extending to the etch-stop layer 120. It will be appreciated by a person skilled in the art that known lithography techniques are used for required patterning to form the holes e.g. 202 and the slits e.g. 204. In the example embodiment, an end point system is utilized, which detects the wavelengths of etch by-products for determining when the respective etching steps are to be stopped.

Following the oxide etch, the CMOS structure 100 is then subjected to a nitride etch, with the substrate holder/heater at a lowered temperature of about 25° C. The etching agent during the nitride etch is a mixture of $CH_3F$ and $O_2$ at an ambient pressure (50 milli-Torr) substantially the same as during the ILD etching in the example embodiment. Referring now to FIG. 2(b), the holes e.g. 202 and the slits e.g. 204 are extended through the nitride etch-stop layer 120 to reach e.g. the polygate 109 and the S/D layers 108, 209 respectively.

Figure 3:
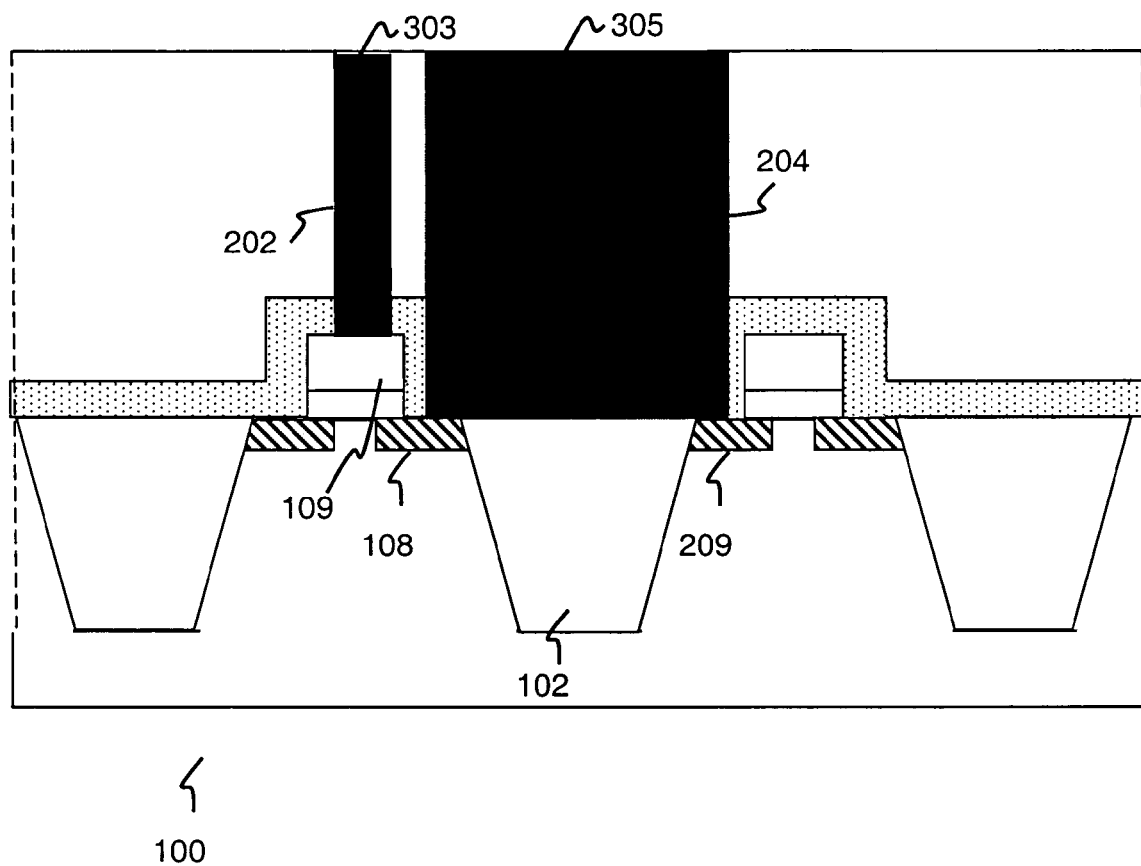
FIG. 3 is a cross-sectional view of a section of a CMOS structure after filling of etched slits and holes with W in an example embodiment.

In the example embodiment, following the formation of the LILs, the slits e.g. 204 and the holes e.g. 202 are filled with W, after formation of a glue/barrier, in the example embodiment Ti/TiN. Chemical and mechanical polishing (CMP) of the W over-layer, followed by chemical oxide buffing are then performed in the example embodiment to complete formation of the W CMP plugs, e.g. 303 and 305, as shown in the cross-sectional view illustrated in FIG. 3. The plugs 303 and 305 provide electrical contact e.g. to and between the S/D implants 108, 209, and to polygate 109.

In the example embodiment, it is observed that by utilising a lower ambient pressure and a lower wafer temperature during the nitride etch, STI over-etch under the slits e.g. 204 can be avoided, while also avoiding under-etching of the holes e.g. 202. More particularly, in order to avoid under-etching of the holes e.g. 202, it is desirable to allow a longer etching time than the etching time required to completely etch the slits e.g. 204 down to the STI oxides e.g. 102.

In the example embodiment, due to an increased mean free path of the etching agent, and an increased selectivity of the nitride etch against etching of the STI oxides e.g. 102, it is possible to reduce the amount of under-etched holes and at the same time reducing over-etching in the STI oxides e.g. 102, even though the nitride etching time is increased. In the example embodiment, subsequent formation of the WCPM plugs 303, 305 will thus not give rise to junction leakages.

Table 2 below lists results illustrating the improved selectivity of the nitride to the oxide in the example embodiment when the wafer temperature is lowered from about 60° C. to about 25° C.

TABLE 2

|  | Nitride Etch Rate | Oxide Etch Rate | Selectivity |
| --- | --- | --- | --- |
| Higher Temp. (~60° C.) | 640 | 138 | 4.64 |
| Lower Temp. (~25° C.) | 1630 | 203 | 8.03 |

Additionally, in the example embodiment, during the nitride etch, a lowered ambient pressure of about 50 milli-Torr (from about 100 milli-Torr in previous processing techniques) increases the mean free path of the reactants in the etching agent. Therefore, in the example embodiment, the high aspect ratio etch capability of the etching agent is improved. This improvement is particularly useful as the LIL aspect ratios increase. Table 3 below lists typical aspect ratios of LILs in different technologies.

TABLE 3

|  | 0.18 um | 0.18 um shrink | 0.16 um |
| --- | --- | --- | --- |
| LIL aspect ratio | 3.2 | 3.33 | 4.10 |

The method of fabrication described above and illustrated in FIGS. 2(a), 2(b) and 3 may be implemented using a single processing chamber, and varying the conditions between the oxide and nitride etch processes, as described above.

In another example embodiment of the present invention, a two-chamber approach may be utilised where each chamber is maintained at a different pressure and temperature level for the purposes of the oxide etch and the nitride etch as described above.

Figure 4:
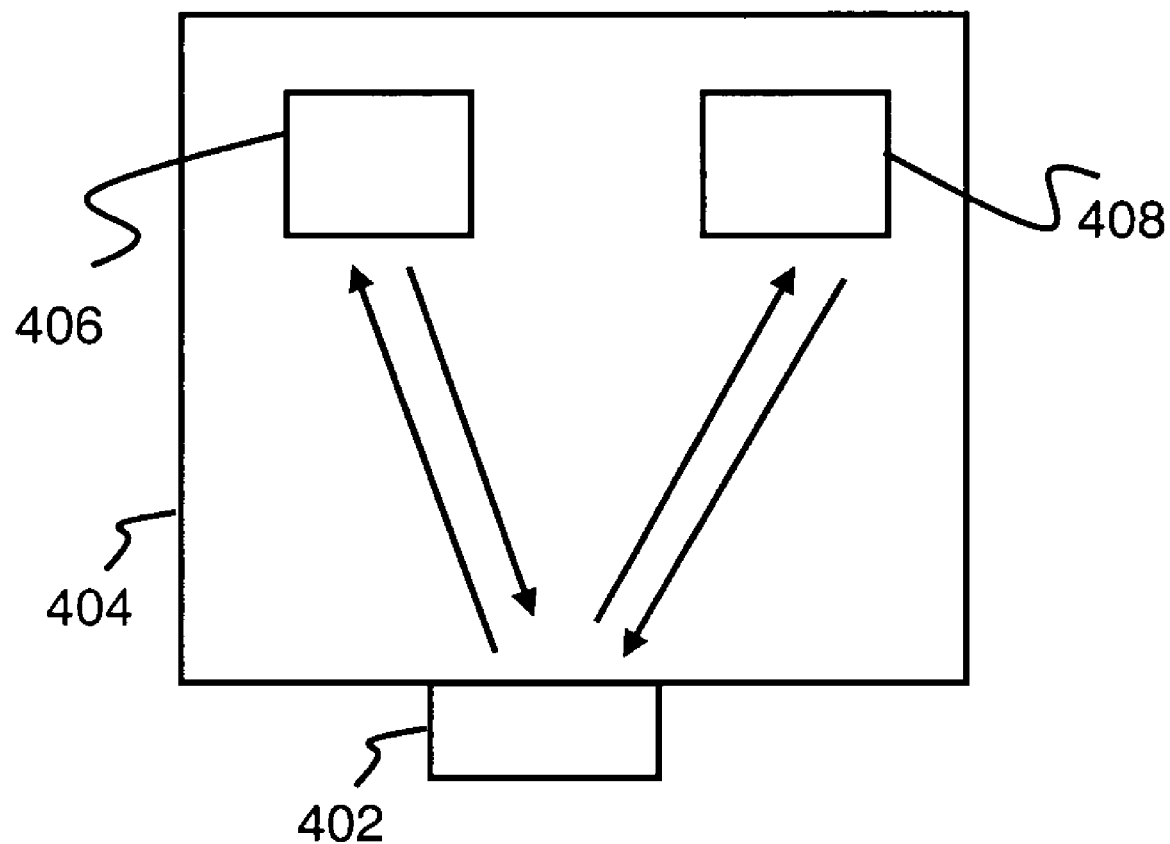
FIG. 4 is a top view of an etching apparatus in an example embodiment.

With reference to FIG. 4, a plurality of wafers comprising CMOS structures are loaded into a load chamber 402 of an etching apparatus 404. The wafers comprising CMOS structures have previously been subjected to photolithography patterning to define the areas for the LILs. The wafers are then tracked into a first processing chamber 406 where the oxide etch process is carried out at an ambient pressure of about 40–50 milli-Torr and the wafers are maintained at a temperature of about 60° C.

Subsequently, in the example embodiment, the wafers are tracked out of the first processing chamber 406 and tracked into a second processing chamber 408 where nitride etching is carried out at an ambient pressure of about 50 milli-Torr, while the wafers are maintained at a temperature of about 25° C.

The wafers are then tracked out of the second processing chamber 408 and unloaded for further processing such as W CMP plugs formation in an example embodiment.

In this example embodiment, by utilising at least two chambers during fabrication, manufacturing efficiency is improved, as compared to etching the wafers in a single chamber where the etching conditions, such as ambient pressure and temperature, are varied and stabilised each time a different etch process is required.

In the example embodiments described above, a yield improvement of about 10% to 15% was observed during test manufacturing. In addition, it is observed that the yield improvement may be obtained for an ambient pressure selected within a range of about 45 to about 55 milli-Torr for the nitride etch process. It was further observed that the yield improvement may be obtained for a wafer temperature of 25° C.±5° C. during the nitride etching.

Figure 5:
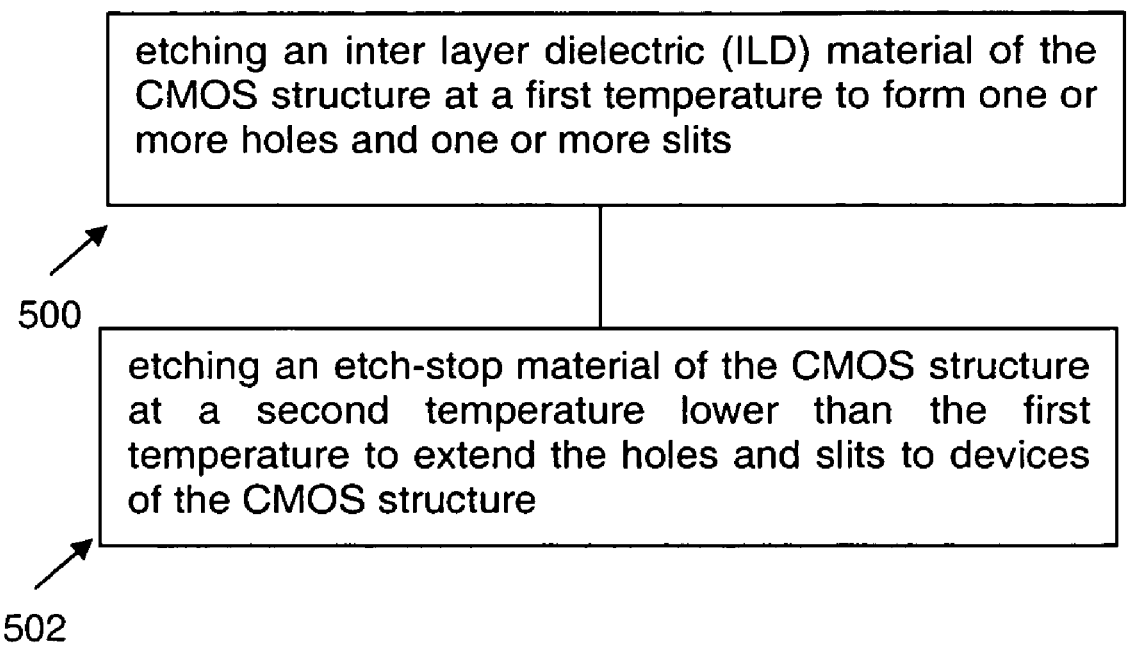
FIG. 5 shows a flow-chart illustrating a method of fabricating LILs of a CMOS structures according to an example embodiment.

FIG. 5 shows a flow-chart illustrating a method of fabricating LILs of a CMOS structures according to an example embodiment. At step 500, an inter layer dielectric (ILD) material of the CMOS structure is etched at a first temperature to form one or more holes and one or more slits. At step 502, an etch-stop material of the CMOS structure is etched at a second temperature lower than the first temperature to extend the holes and slits to devices of the CMOS structure.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. A method of fabricating local interconnect lines (LILs) of a CMOS structure, the method comprising:
    performing a first temperature etching step for etching an inter layer dielectric (ILD) material of the CMOS structure at a first temperature to simultaneously form one or more holes and one or more slits, each slit having an exposed area at least about five times larger than each hole; and
    performing a second temperature etching step for etching an etch-stop material of the CMOS structure at a second temperature lower than the first temperature to simultaneously extend the holes and slits to devices of the CMOS structure, and such that over-etching of the slits and under-etching of the holes are reduced compared to etching at the first temperature.

2. The method as claimed in claim 1, wherein the second temperature is chosen such that a selectivity of the etch-stop material etching at the second temperature is increased compared to a selectivity of the etch-stop material etching at the first temperature.

3. The method as claimed in claim 1, wherein the ILD material and the etch-stop material are etched substantially at the same ambient pressure.

4. The method as claimed in claim 1, wherein the etch-stop material is etched at a pressure in a range from about 45 to about 55 milli-Torr.

5. The method as claimed in claim 1, wherein the etch-stop material is etched at a pressure chosen such that a mean free path is increased compared to a mean free path at about 100 milli-Torr.

6. The method as claimed in claim 1, wherein the etch-stop material is etched at an ambient pressure of about 50 milli-Torr.

7. The method as claimed in claim 1, wherein the ILD material is etched at an ambient pressure of about 40 to 50 milli-Torr.

8. The method as claimed in claim 1, wherein the second temperature is 25° C.±5° C.

9. The method as claimed in claim 1, wherein the first temperature is about 60° C.

10. The method as claimed in claim 1, wherein an etching agent for the etching of the etch-stop material comprises a mixture of $CH_3F$ and $O_2$.

11. The method as claimed in claim 9, wherein the etching agent for the etching of the ILD material comprises a mixture of $C_4F_8$, oxygen and Argon.

12. The method as claimed in claim 1, wherein a first processing chamber is used for the etching of the ILD material and a second processing chamber is used for the etching of the etch-stop material.

13. The method as claimed in claim 1, wherein the ILD material comprises TEOS.

14. The method as claimed in claim 1, wherein the etch-stop material comprises SiN.

15. The method as claimed in claim 1, wherein the CMOS structure is silicon based.

16. A CMOS structure fabricated using the method as claimed in claim 1.

17. A method of fabricating local interconnect lines (LILs) of a CMOS structure, the method comprising:
    etching an inter layer dielectric (ILD) material of the CMOS structure at a first temperature to form one or more holes and one or more slits, each slit having an exposed area at least about five times larger than each hole; and
    etching an etch-stop material of the CMOS structure at a second temperature lower than the first temperature to extend the holes and slits to devices of the CMOS structure, and such that over-etching of the slits and under-etching of the holes are reduced compared to etching at the first temperature,
    wherein a first processing chamber is used for the etching of the ILD material and a second processing chamber is used for the etching of the etch-stop material.

18. A method of fabricating local interconnect lines (LILs) of a CMOS structure, the method comprising:
    etching an inter layer dielectric (ILD) material of the CMOS structure at a first temperature to form one or more holes and one or more slits, each slit having an exposed area at least about five times larger than each hole; and
    etching an etch-stop material of the CMOS structure at a second temperature lower than the first temperature to extend the holes and slits to devices of the CMOS structure, and such that over-etching of the slits and under-etching of the holes are reduced compared to etching at the first temperature,
    wherein the ILD material comprises TEOS.

19. The method as claimed in claim 1, wherein each slit is adapted to expose portions of at least two transistors, and wherein each hole is adapted to expose a portion of a single transistor.

20. The method as claimed in claim 1, wherein each slit is adapted to expose at least two portions of the CMOS structure separated by a shallow trench isolation (STI) oxide, and wherein each hole is adapted to expose a portion of the CMOS structure between at least two STI oxides.

21. The method as claimed in claim 1, wherein the CMOS structure comprises Source/Drain (S/D) implants and a polygate, wherein at least one of the slits is adapted to expose the S/D implants of the CMOS structure, and wherein at least one of the holes is adapted to expose the polygate of the CMOS structure.

* * * * *